(12) United States Patent
Mucenieks et al.

(10) Patent No.: US 6,407,635 B2
(45) Date of Patent: Jun. 18, 2002

(54) CARRIER-BLANKING MECHANISM FOR SWEEPING DETECTOR USED TO MEASURE AND CORRECT RF POWER AMPLIFIER DISTORTION

(75) Inventors: Lance Todd Mucenieks, Boulder Creek, CA (US); David Kent Bonds, Quincy, IL (US)

(73) Assignee: Spectrian Corporation, Sunnyvale, CA (US)

( * ) Notice: Subject to any disclaimer, the term of this patent is extended or adjusted under 35 U.S.C. 154(b) by 0 days.

(21) Appl. No.: 09/928,127

(22) Filed: Aug. 10, 2001

Related U.S. Application Data

(63) Continuation of application No. 09/479,723, filed on Jan. 7, 2000, now abandoned.

(51) Int. Cl.[7] .................................................. H03F 1/26
(52) U.S. Cl. ........................................ 330/149; 330/136
(58) Field of Search ................................ 330/149, 151, 330/136; 375/296, 297

(56) References Cited

U.S. PATENT DOCUMENTS

| | | | |
|---|---|---|---|
| 4,885,551 A | 12/1989 | Myer | 330/52 |
| 5,119,040 A | 6/1992 | Long et al. | 330/149 |
| 5,489,875 A | 2/1996 | Cavers | 330/151 |
| 5,565,814 A | 10/1996 | Fukuchi | 330/52 |
| 5,742,201 A | 4/1998 | Eisenberg et al. | 330/2 |
| 5,923,214 A | 7/1999 | Mitzlaff | 330/52 |
| 5,929,704 A | 7/1999 | Proctor, Jr. et al. | 330/149 |
| 6,078,216 A | 6/2000 | Proctor, Jr. | 330/151 |
| 6,144,255 A | 11/2000 | Patel et al. | 330/151 |

*Primary Examiner*—Robert Pascal
*Assistant Examiner*—Henry Choe
(74) *Attorney, Agent, or Firm*—Allen, Dyer, Doppelt, Milbrath & Gilchrist, P.A.

(57) ABSTRACT

RF power amplifier distortion can be accurately measured in the presence of multi-frequency input signals, by using a swept local oscillator to tune RF input and output receivers. The power detected by the input receiver is compared with a threshold associated with the carrier. Whenever the power detected by the input receiver exceeds the threshold—indicating that the input receiver is tuned on carrier energy—the signal path through the output receiver is blanked. The sweeping action combined with selective blanking of the output receiver creates an adaptive notch filter, which allows for the direct measurement of low level distortion power in the presence of high power carriers. This distortion power is digitized and can be processed to control pre-distortion correction circuitry or gain/phase adjustment circuitry of a feed-forward error correction loop.

21 Claims, 4 Drawing Sheets

CARRIER-BLANKING MECHANISM FOR SWEEPING DETECTOR USED TO MEASURE AND CORRECT RF POWER AMPLIFIER DISTORTION

CROSS-REFERENCE TO RELATED APPLICATION

This application is a continuation of pending U.S. application Ser. No. 09/479,723, filed on Jan. 7, 2000, now abandoned.

FIELD OF THE INVENTION

The present invention relates, in general to radio frequency (RF) communication systems, and is particularly directed to an RF power amplifier distortion correction mechanism, that employs a swept oscillator to locate and isolate the RF carrier component in the RF power amplifier output, so that distortion energy produced at the output of the amplifier may be detected. Once detected, the distortion energy may be controllably removed by a digital signal processor-controlled distortion cancellation device, such as pre-distortion unit installed in the input path of the RF power amplifier, or a gain/phase adjustment unit installed in the error path of a feed-forward RF amplifier.

BACKGROUND OF THE INVENTION

The specifications and regulations of the Federal Communications Commission (FCC) mandate that communication service providers comply with very strict bandwidth constraints, including the requirement that the amount of energy spillover outside a licensed channel or band of interest, be sharply attenuated (e.g., on the order of 50 dB). Although such limitations may be readily overcome for traditional forms of modulation, such as FM, they are difficult to achieve using more contemporary, digitally based modulation formats, such as M-ary modulation.

Attenuating sidebands sufficiently to meet industry or regulatory-based standards using such modulation techniques requires very linear signal processing systems and components. Although relatively linear components can be obtained at a reasonable cost for the relatively low bandwidths (baseband) of telephone networks, linearizing components such as power amplifiers at RF frequencies can be prohibitively expensive.

A fundamental difficulty in linearizing an RF power amplifier is the fact that it is an inherently non-linear device, and generates unwanted intermodulation distortion products (IMDS). IMDs manifest themselves as spurious signals in the amplified RF output signal, separate and distinct from the RF input signal. A further manifestation of IMD is spectral regrowth or spreading of a compact spectrum into spectral regions that were not occupied by the RF input signal. This distortion causes the phase-amplitude of the amplified output signal to depart from the phase-amplitude of the input signal, and may be considered as an incidental (and undesired) amplifier-sourced modulation of the RF input signal.

A straightforward way to implement a linear RF power amplifier is to build it as a large, high power device, but operate the amplifier at a only a low power level (namely, at a small percentage of its rated output power), where the RF amplifier's transfer function is relatively linear. An obvious drawback to this approach is the overkill penalty—a costly and large sized RF device. Other prior art techniques which overcome this penalty include feedback correction techniques, feedforward correction, and pre-distortion correction.

Feedback correction techniques include polar envelope correction (such as described in U.S. Pat. No. 5,742,201), and Cartesian feedback, where the distortion component at the output of the RF amplifier is used to directly modulate the input signal to the amplifier in real time. Feedback techniques possess the advantage of self-convergence, as do negative feedback techniques in other fields of design. However, systems which employ negative feedback remain stable over a limited bandwidth, which prevents their application in wide-bandwidth environments, such as multi-carrier or W-CDMA. Feedforward and predistortion correction, however, are not limited in this regard.

In the feedforward approach, error (distortion) present in the RF amplifier's output signal is extracted, amplified to the proper level, and then reinjected with equal amplitude but opposite phase into the output path of the amplifier, so that (ideally) the RF amplifier's distortion is effectively canceled.

With predistortion correction, a signal is modulated onto the RF input signal path upstream of the RF amplifier. The ideal predistortion signal has a characteristic, which is the inverse of the distortion expected at the output of the high power RF amplifier, so that when subjected to the distorting transfer function of the RF amplifier, it effectively cancels the distortion behavior.

Either predistortion or feedforward may be made adaptive by extracting an error signal component in the output of the RF amplifier and then adjusting the control signal(s), in accordance with the extracted error behavior of the RF amplifier, so as to effectively continuously minimize distortion in the amplifier's output.

One of the conventional mechanisms for extracting the error signal component is to inject a pilot (tone) signal into the signal flow path through the amplifier and measure the amplifier's response. A fundamental drawback to the use of a pilot tone is the need for dedicated pilot generation circuitry and the difficulty of placing the pilot tone within the signal bandwidth of the amplifier. Other approaches employ a high intercept receiver to detect low level distortion in the presence of high power carriers, which adds substantial complexity and cost.

SUMMARY OF THE INVENTION

In accordance with the present invention, RF power amplifier distortion is accurately measured, even in the presence of multi-frequency input signals, by using a swept local oscillator to tune respective RF input and output receivers. The power detected by the tuned input receiver is compared with a power reference to determine the presence of carrier at the amplifier's input. Whenever the power detected by the input receiver exceeds the power of the reference—indicating the presence of carrier energy within the tuned receiver's bandwidth—a similar signal path through the output tuned receiver may be controllably blanked with a high isolation switch. As a result, as the output receiver is swept across the bandwidth of the amplifier output signal, only distortion energy will be detected by the output receiver. The distortion energy detected by the output receiver may be digitized and processed to control pre-distortion correction circuitry upstream of the RF amplifier, or gain/phase adjustment circuitry in the error path of a feedforward error correction loop.

Pursuant to a first, dual (input-output) receiver-based embodiment of the present invention, an adaptive predistortion circuit is installed upstream of an RF power amplifier that has a relatively "low" carrier-to-interference distortion ratio (C/I) output signal. By relatively a low C/I ratio output signal is meant one in which the RF carrier level is effectively indistinguishable from that of intermodulation products, such as for the case of mixed modulation multicarrier signals and multicarrier signals having different power levels. (In contrast, a relatively 'high' C/I output signal, such as that produced at the output of a highly linear RF amplifier with equal power carriers, is one in which the level of the RF carrier is readily distinguishable from that of the IMDs.)

In the first, predistortion embodiment of the invention, the RF input signal to be amplified is coupled through a directional coupler to an input mixer and an IF bandpass filter used as part of a swept input receiver, which detects the presence of carrier energy at the input to the RF amplifier. Whenever the carrier energy detected by the input receiver exceeds a predefined threshold, a controllably swept output receiver coupled through a directional coupler to the output of the RF amplifier is blanked by a threshold detector. The output of the threshold detector is monitored by a digital signal processor (DSP) controller to keep track of where (in the swept spectrum) carrier energy is located.

A common sweep frequency for each of the input and output receivers is derived from the same local oscillator, that is controlled by a digital sweep-control signal generated by the DSP. The output of the swept oscillator is split and fed to respective mixers of the input and output receivers. The IF output of the input mixer is filtered by a slightly wider bandpass filter and coupled to a carrier energy detector, whose output is monitored by a threshold detector. The output of the threshold detector is coupled to a blanking detector input of the DSP and to control ports of isolation switches in the output receiver.

During controlled variation (e.g., sweep) of the drive frequency for the input and output receivers, as long as the output of the carrier energy detector does not exceed a prescribed threshold associated with an RF carrier signal, the signal flow path through the output receiver is considered to be representative of amplifier distortion, and is therefore detected as an error signal by the DSP. In response to this error signal the DSP adaptively adjusts the parameters of a predistortion unit in order to compensate for the distortion.

However, if the detected carrier energy exceeds the prescribed carrier-associated threshold, the output of the threshold detector changes state, providing both a blanking signal to the DSP and a control signal to blank (interrupt) the signal flow path through the output receiver. In this manner, the DSP's adjustment of the parameters of the predistortion unit will remain independent of the presence of an RF carrier. Moreover, such carrier-based selective blanking of the distortion measurement receiver circuitry prevents saturation of the output receiver's IF amplifier, and allows the use of lower third order intercept (IP3) components.

In accordance with a second, predistortion embodiment of the invention for use with an RF power amplifier having a high C/I ratio, the circuit architecture of the controllably blanked distortion energy measurement subsection is simplified. In particular, the input receiver mixer is eliminated, leaving only the output receiver mixer, which downconverts the output of the RF power amplifier. To allow for carrier threshold-based blanking, the downconverted output receiver's mixer is split into two paths: one to a wider band carrier—threshold detector, the other to a narrower band distortion detector, via isolation switches.

As in the first embodiment, the output of the carrier detector is compared with a threshold during the frequency sweep of the local oscillator. Whenever the detector output exceeds the threshold—indicating the presence of carrier energy within the carrier detector's bandwidth—a blanking signal is generated, so as to interrupt the signal path to the distortion detector.

In addition to applying the invention to measure distortion for adjusting the parameters of a predistortion unit upstream of the RF amplifier, the invention may be employed in an RF power amplifier distortion measurement and correction scheme, in which a DSP-controlled adaptive predistortion adjustment circuit is installed in a feed-forward cancellation amplifier path downstream of the RF amplifier. Again, either a low or a high C/I ratio version of the controllably blanked distortion energy measurement subsection described above may be employed, depending upon the amplifier's characteristics.

Pursuant to a third embodiment of the invention, a DSP-controlled, adaptive gain/phase adjustment circuit is installed in the error path of a feed-forward amplifier, which utilizes a relatively low C/I ratio main RF power amplifier. The RF input port to the main RF power amplifier is coupled to a first RF signal loop that includes an upstream gain/phase adjustment circuit, such as a vector modulator. The RF input port is further fed through a directional coupler to a second RF signal flow path via a delay line to a first port of an RF carrier cancellation combiner of a feed-forward error extraction and reinjection loop. A portion of the amplified signal output of the RF amplifier is extracted and coupled to a second port of the carrier cancellation combiner. The carrier cancellation combiner serves to cancel a time-aligned RF carrier component in the second RF signal flow path from the output of the RF amplifier and provides an RF error signal representative of the distortion or IMDs.

The RF error signal produced by the RF cancellation combiner is coupled to a DSP-controlled gain/phase adjustment circuit for the feed-forward error correction and reinjection loop. The output of this gain/phase adjustment circuit is amplified in a feed-forward RF error amplifier and reinjected into the output path of the main RF amplifier. In order to monitor and adaptively control, the gain and phase of the feed-forward error path, its associated control processor is supplied with amplifier distortion signals by way of a controllably blanked distortion energy measurement subsection, configured and operating in the same manner as the first embodiment, described above.

In accordance with a fourth embodiment of the invention for a relatively high C/I ratio amplifier, the dual receiver-containing controllably blanked distortion energy measurement subsection of the low C/I amplifier of the third embodiment is replaced by the reduced complexity single receiver-based, controllably blanked distortion energy measurement subsection of the second embodiment.

DETAILED DESCRIPTION

Figure 1:
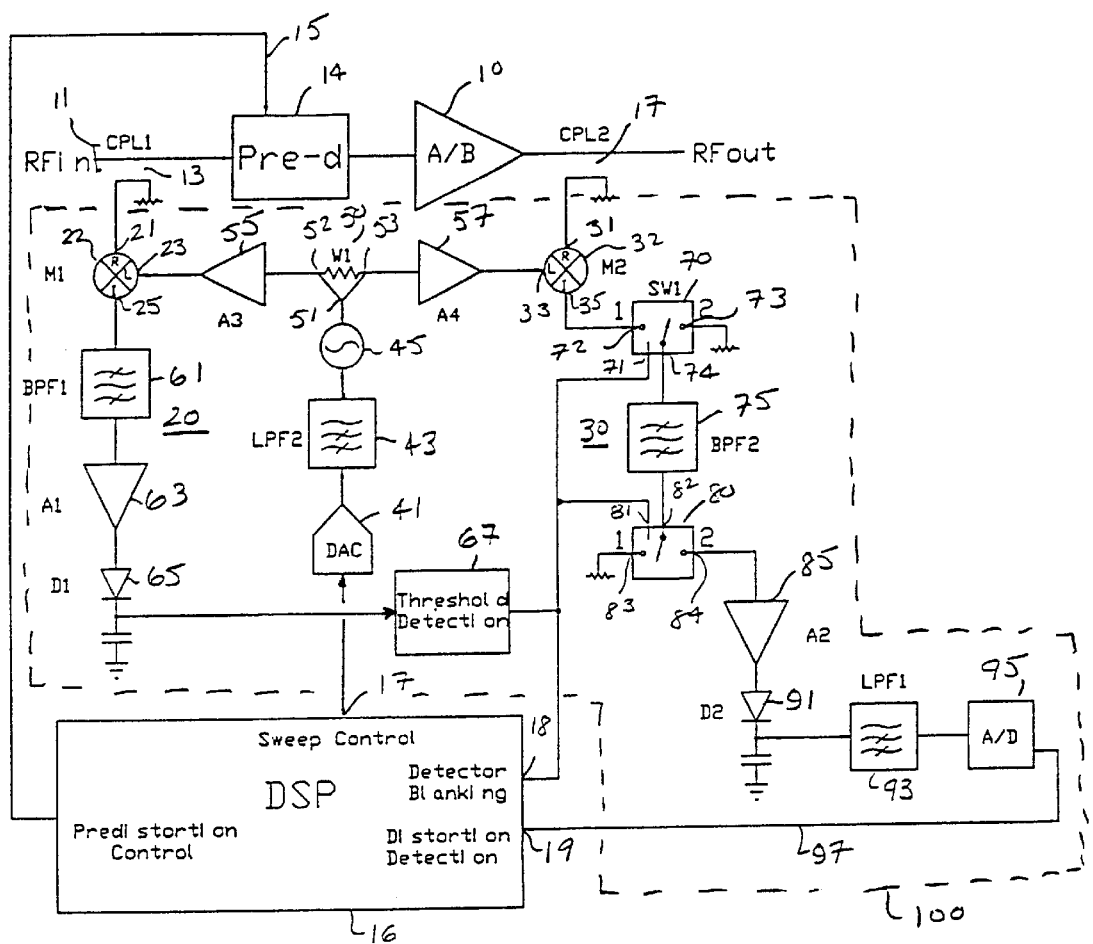
FIG. 1 diagrammatically illustrates an RF power amplifier distortion measurement and pre-distortion correction scheme in accordance with a first, dual receiver embodiment of the invention.

Before describing in detail the new and improved RF power amplifier distortion measurement and correction mechanism in accordance with the present invention, it should be observed that the invention resides primarily in a prescribed arrangement of conventional RF communication circuits, associated digital signal processing components and attendant supervisory control circuitry, that controls the operation of such circuits and components. As a result, the configuration of such circuits components, and the manner in which they interface with other communication system equipment have, for the most part, been illustrated in the drawings by readily understandable block diagrams, which show only those details that are pertinent to the present invention, so as not to obscure the disclosure with details which will be readily apparent to those skilled in the art having the benefit of the description herein. Thus, the block diagram illustrations are primarily intended to show the major components of an RF amplifier distortion measurement and correction system in a convenient functional grouping., whereby the present invention may be more readily understood.

FIG. 1 diagrammatically illustrates a non-limiting example of a first embodiment of an RF power amplifier distortion measurement and correction scheme in accordance with the present invention, in which an adaptive predistortion circuit is installed upstream of an RF amplifier 10 having a relatively "low" carrier to intermod ratio (C/I). As pointed out above, by relatively low C/I ratio RF amplifier is meant one in which the RF carrier level is effectively indistinguishable from that of intermodulation products. As a non-limiting example, a low C/I ratio may describe amplifiers with intermodulation products higher than −50 dBC.

As shown in FIG. 1, an RF input signal $RF_{in}$ to be amplified is coupled to an input port 11 of a signal input path to the RF power amplifier 10, the distortion characteristic of which is to be measured by a controllably blanked distortion energy detector subsection 100. In order to monitor the RF input signal for the presence of carrier energy, the RF input port 11 is coupled through a first directional coupler 13 to a first input 21 of a mixer 22 within a controllably tuned or swept input receiver 20, and to a digitally controlled predistortion unit 14 installed in the signal input path to the RF power amplifier 10.

The predistortion unit 14, which is operative to dynamically adjust the amplitude and phase of the RF input signal to the RF amplifier 10, may contain a vector modulator driven by a complex polynomial work function, and is coupled to receive a set of weighting coefficients $w_0, w_1, w_2, \ldots w_N$, supplied over a multi-link 15 by a performance monitoring and parameter updating digital signal processor (DSP) 16. The DSP executes one or more error minimization algorithms (e.g., power or least mean) for adjusting the distortion generated by the predistortion unit 14. The output of the RF power amplifier 10 is coupled to an RF output port $RF_{out}$ and through a second directional coupler 17 to a first input 31 of a mixer 32 within a controllably tuned or swept output receiver 30. The output of the directional coupler 17 is representative of the A amplified original RF input signal and any intermodulation (spectral regrowth) distortion products (IMDs) introduced by the RF amplifier 10.

Each of the input and output receivers 20, 30 is controlled by a digital sweep-control signal generated by the DSP 16. For this purpose, digital sweep-control signal lines 17 are coupled to a digital-to-analog converter (DAC) 41, which produces an analog output sweep voltage that is filtered in a low pass filter 43 and coupled to a voltage controlled oscillator (VCO) 45. The output of the VCO 45 is coupled to an input port 51 of a Wilkinson splitter 50. Wilkinson splitter 50 has a first output port 52, which is coupled through a buffer amplifier 55 to a second input 23 of mixer 22, and a second output port 53, which is coupled through a buffer amplifier 57 to a second input 33 of mixer 32. The IF output 25 of mixer 22 is filtered by a wider band bandpass filter 61 and coupled through a buffer amplifier 63 to a carrier power detector 65, shown as a diode, the cathode of which is capacitor-coupled to ground.

The carrier power detector 65 has its output coupled to a threshold detector 67, the output of which is coupled to a blanking detector input 18 of the DSP 16, and to respective control ports 71, 81 of a pair of controlled high isolation switches 70 and 80 in the output receiver 30. In the absence of the output of carrier power detector 65 exceeding a prescribed threshold associated with an RF carrier signal, the output of the threshold detector 67 is at a first logic state. However, if the carrier power detector 65 detects power in excess of the prescribed threshold, the output of the threshold detector 67 changes to a second logic state. This change in state of the blanking signal input 18 to the DSP 16 is employed to controllably blank the output receiver 30, through which RF amplifier distortion is measured.

For this purpose, the IF output 35 of mixer 32 is coupled to a first input port 72 of switch 70, a second input port 73 of which is impedance-terminated, as shown. Switch 70 has an output port 74 coupled through a narrower band bandpass filter 75 to a first input port 82 of switch 80, a second input port 83 of which is impedance-terminated, as shown. Switch 80 has an output port 84 coupled through an IF buffer amplifier 85 to a (distortion) power detector 91, shown as a diode whose cathode is capacitor-coupled to ground, and which serves to measure the distortion power within the output receiver bandwidth generated by RF amplifier 10.

The distortion power detector 91 has its output coupled through a lowpass filter 93 to an analog-to-digital converter (ADC) 95, the digitized output of which is coupled over link 97 to a distortion detection input 19 of the DSP 16. As described above, this digitized output of the distortion power detector is integrated and processed by the DSP 16 using one or more error minimization algorithms for controlling the variable attenuator and phase shift components in the predistortion unit 14.

In accordance with the operation of the controllably blanked distortion energy measurement subsection 100, the signal path through the output receiver 30 is normally coupled through switches 70 and 80 to the distortion power detector 91, the output of which is sampled, digitized and coupled to the distortion input 19 of the DSP 16, as described above.

As the DSP 16 sweeps the control voltage input to the VCO 45, the tuning frequency for each of the input and output receivers 20 and 30 is swept in common. During this frequency sweep, the power detected by the carrier power detector 65 of the input receiver 20 is applied to threshold detector 67, whose threshold differentiates between carriers and distortion. As long as the threshold of the threshold detector 67 is not exceeded, it is inferred that the output of receiver 30 is distortion power produced in the RF power amplifier 10. This distortion power is digitized and coupled to the processor 16 and integrated over an entire sweep for controlling the predistortion correction circuitry 14, as described above.

However, whenever the output of the carrier power detector 65 exceeds the threshold of threshold detector 67—indicating that the output receiver is tuned near carrier energy—the output of the threshold detector 67 changes to its second logic state, as described above. This causes the signal paths through switches 70 and 80 to be interrupted, effectively blanking the output receiver 30, so that the distortion correction operation performed by DSP 16 is not effected by the carrier. This carrier-based selective blanking of the distortion measurement receiver circuitry prevents saturation of the output receiver's IF amplifier 85, and allows the use of lower IP3 components. The bandwidth of the input receiver 20, which is dictated by the bandpass filter 61, may be made slightly wider than the bandwidth of the output receiver 30 to provide a guardband, as appropriate, for the switching operation.

Figure 2:
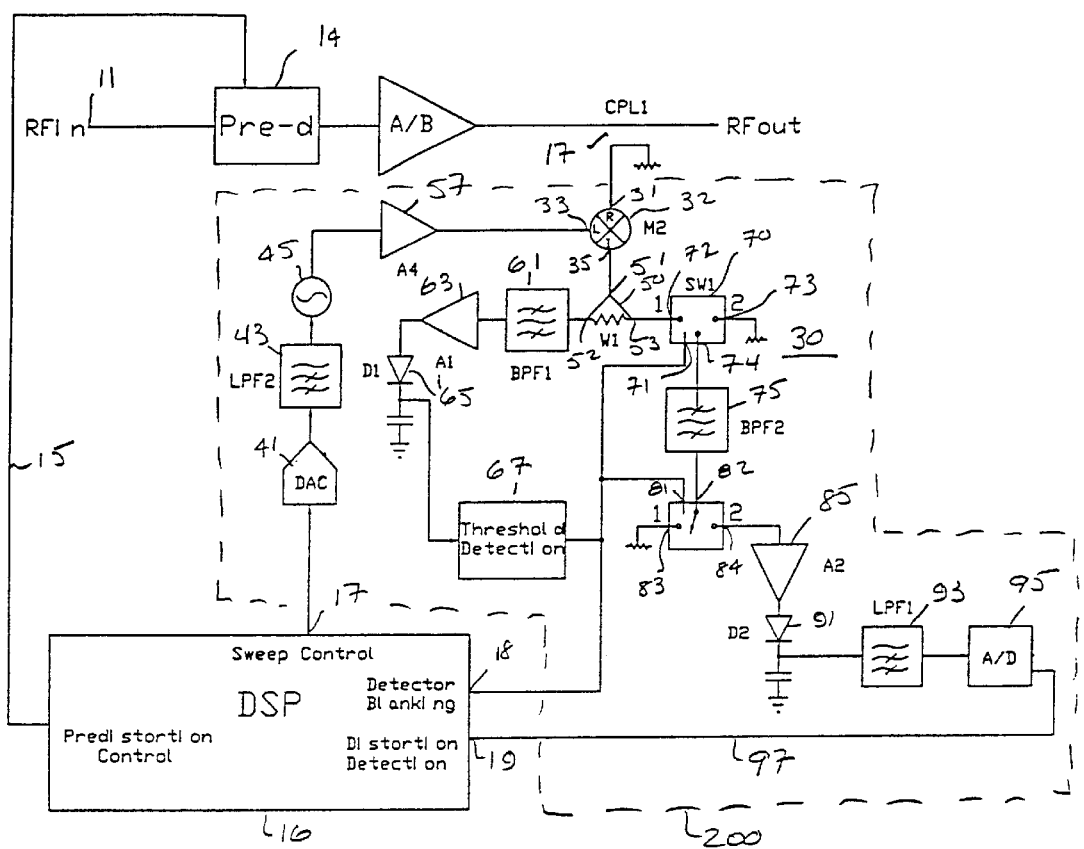
FIG. 2 diagrammatically illustrates an RF power amplifier distortion measurement and pre-distortion correction scheme of a second, single receiver embodiment of the invention.

FIG. 2 diagrammatically illustrates a non-limiting example of an RF power amplifier distortion measurement and correction scheme in accordance with a second embodiment of the present invention, in which an adaptive predistortion circuit is installed upstream of an RF amplifier having a relatively "high" C/I ratio. As pointed out above, by relatively high C/I ratio RF amplifier is meant a highly linear RF amplifier in which the level of the RF carrier is readily distinguishable from that of intermods. As a non-limiting example, a high C/I ratio may fall in a range on the order of −65 to −70 dBC.

The use of a high C/I RF amplifier allows the output mixer to be used by both the carrier detector and the distortion detector, without introducing errors in distinguishing between a carrier signal and distortion. This simplifies the circuit design of a controllably blanked distortion energy measurement subsection 200 by eliminating the input mixer and its associated amplifier.

More particularly, as in the embodiment of FIG. 1, the RF input signal $RF_{in}$ to be amplified is coupled to an input port 11 of a signal path for the RF power amplifier 10. However, as there is no input receiver, the signal path provided by the first directional coupler of FIG. 1 is absent in FIG. 2. Instead, the RF input port is coupled directly to the digitally controlled predistortion unit 14. The output of the RF power amplifier 10 is coupled to an RF output port $RF_{out}$, and through a directional coupler 17 to the first input 31 of the mixer 32 within the controllably swept output receiver 30 of the reduced complexity controllably blanked distortion energy measurement subsection 200.

As in the first embodiment, the output receiver 30 is controlled by a digital sweep signal generated by the DSP 16 and coupled to DAC 41. The analog sweep voltage produced by the DAC 41 is filtered in low pass filter 43 and coupled to VCO 45. The output of VCO 45 is coupled through buffer amplifier 57 to the second input 33 of mixer 32. The output 35 of mixer 32 is coupled to input port 51 of Wilkinson splitter 50. Wilkinson splitter 50 has its first output port 52 filtered by wider band bandpass filter 61 and coupled through a buffer amplifier 63 to carrier power detector 65. As in the embodiment of FIG. 1, the carrier power detector 65 has its output coupled to threshold detector 67, the output of which is coupled to DSP 16 and to respective control ports 71, 81 of controlled high is isolation switches 70 and 80 in the output receiver.

The second output port 53 of the Wilkinson splitter 50 is coupled to the first input port 72 of switch 70, the second input port 73 of which is impedance-terminated, as shown. Switch 70 has output port 74 coupled through a narrower band bandpass filter 75 to the first input port 82 of switch 80, the second input port 83 of which is impedance-terminated, as shown. Switch 80 has its output port 84 coupled through the IF buffer amplifier 85 to the distortion power detector 91, to measure the (distortion) energy in the output of the RF amplifier 10. The distortion power detector 91 has its output coupled through lowpass filter 93 to an analog-to-digital converter (ADC) 95, whose digitized output of coupled over link 97 to DSP 16.

The operation of the high C/I embodiment of FIG. 2 is similar to that of FIG. 1 described above, except that there is no input receiver. Namely, the signal path through the output receiver 30 is normally coupled through switches 70 and 80 to detector 91, the output of which is sampled, digitized and coupled to DSP 16. As the DSP 16 controllably varies the control voltage input to the VCO 45, the tuning frequency for the output receiver 30 is swept. During this sweep, the output of the carrier power detector 65 is compared in the threshold detector 67 with a threshold which differentiates between carriers and intermodulation distortion.

Whenever the output of the carrier power detector 65 exceeds the exceeds the threshold of threshold detector 67—indicating that the receiver is tuned on carrier power from the RF amplifier 10, the blanking detector-coupled output of the threshold detector 67 changes to its second logic state, so that the signal paths through switches 70 and 80 are interrupted, effectively blanking the output receiver 30. As a consequence, the energy detected by the distortion power detector 91 for the output receiver 30 during the sweep is RF power amplifier distortion energy that is exclusive of carriers. This distortion power is digitized and coupled to the distortion detection input 19 of the processor 16 for controlling the predistortion correction circuitry 14, as described above.

Figure 3:
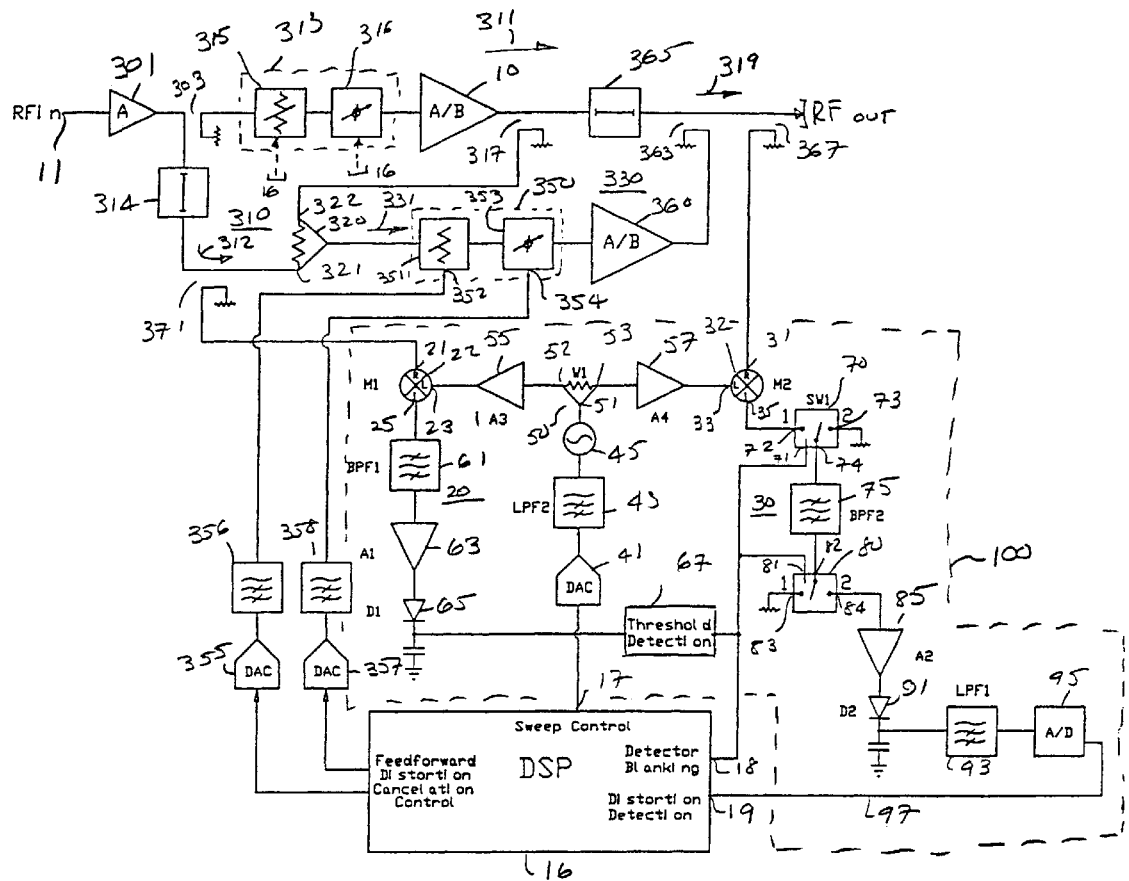
FIG. 3 diagrammatically illustrates an RF power amplifier distortion measurement and post-distortion correction scheme of a third, dual receiver embodiment of the invention.

FIG. 3 diagrammatically illustrates a non-limiting example of a third embodiment of an RF power amplifier distortion measurement and correction scheme in accordance with the present invention, in which a DSP-controlled gain/phase adjustment circuit is installed in a feed-forward error path, coupled downstream of an RF amplifier 10 having a relatively "low" C/I ratio, and whose distortion characteristic is to be measured.

For this purpose, the RF input port 11 is coupled through an input buffer amplifier 301 and directional coupler 303 to a first RF signal flow path 311 of a carrier cancellation loop 310, that includes a gain/phase adjustment circuit 313 coupled upstream of the RF amplifier 10. The gain/phase adjustment circuit 313 may comprise a vector modulator formed of respective RF amplitude and phase adjustment circuits 315 and 316. As shown by the broken line inputs to circuits 315 and 316, gain/phase adjustment circuit 313 may be controlled by amplitude and phase adjustment signals sourced from the DSP 16.

The input port 11 is further coupled to a second RF signal flow path 312 containing a delay circuit 314, the output of which is coupled to a first port 321 of an RF carrier cancellation combiner 320 (for example, a Wilkinson splitter/combiner, as a non-limiting example) of a feed-forward error extraction and reinjection loop 330. The delay circuit 315 is operative to provide a delay corresponding to the insertion delay imparted to the first RF signal flow path 311 by the gain/phase adjustment circuit 313 and RF amplifier 10.

A portion of the amplified signal output of the RF amplifier 10 is extracted via a directional coupler 317 and coupled to a second port 322 of the carrier cancellation combiner 320. As in the first two embodiments, the output of the directional coupler 317 is representative of the amplified original RF input signal and any IMDs introduced by the RF amplifier 10. The carrier cancellation combiner 320 is operative to cancel the delayed (time aligned) RF carrier component supplied by the second RF signal flow path 312 from the output of the RF amplifier 10, and thus provide an RF error signal representative of the IMDs.

The RF error signal produced by the RF cancellation combiner 320 is coupled to a DSP-controlled gain/phase adjustment circuit 350 of the feed-forward distortion cancellation loop 330. The gain/phase adjustment circuit 350 is shown as comprising a vector modulator having respective amplitude and phase control units 351 and 353. The amplitude and phase control units 351 and 353 have respective control inputs 352 and 354 to which amplitude and phase adjustment signals ($G_2$, $\Phi_2$) are sourced from the DSP 16.

To control the operation of the gain/phase adjustment circuit 350, a digital gain control signal from the DSP 16 is converted into analog format by a DAC 355. The output of DAC 355 is filtered in a low pass filter 356 and coupled to gain control input 352 of gain control circuit 351. A digital phase control signal from the DSP 16 is converted into analog format by a DAC 357, the output of which is filtered in a low pass filter 358 and coupled to gain control input 354 of phase control circuit 353.

The output of the gain/phase adjustment circuit 350 is amplified in a feed-forward RF error amplifier 360, and then reinjected into the output path 319 of the RF amplifier 10 by way of a reinjection directional coupler 363. The directional coupler 363 is installed downstream of a delay unit 365, to which the output path 319 of RF amplifier 10 is coupled. The delay unit 365 provides an effective delay corresponding to the insertion delay of the components in an RF error signal flow path 331 through the RF cancellation combiner 320, gain/phase adjustment circuit 350 and feed-forward RF error amplifier 360 of the feed-forward error in feed-forward error correction and reinjection loop 330.

In order to monitor and adaptively control the parameters of the gain/phase adjustment circuit 350, the digital signal processor 16 is coupled through the controllably blanked switching components of the RF output-monitoring receiver circuitry 30 within the controllably blanked distortion energy measurement subsection 100, which is configured and operates in the same manner as described above with reference to the embodiment of FIG. 1. In particular, a portion of the composite signal in the RF amplifier's signal output path 319 is extracted via a directional coupler 367 installed downstream of reinjection directional coupler 363. This extracted signal is coupled to a first input 31 of mixer 32 of the output receiver 30.

The difference in operation of the embodiments of FIG. 3 and FIG. 1 relates to the use of the measured distortion energy by the DSP 16. In the embodiment of FIG. 1, the measured distortion energy is used to controllably adjust the parameters of the predistortion unit 14 in the signal input flow path to the RF amplifier 10. In the embodiment of FIG. 3, the measured distortion energy is used to controllably adjust the parameters of the gain/phase adjustment circuit 350 in the RF error signal flow path 331 to feed-forward RF error amplifier 360 of the feed-forward error correction and reinjection loop 330.

Figure 4:
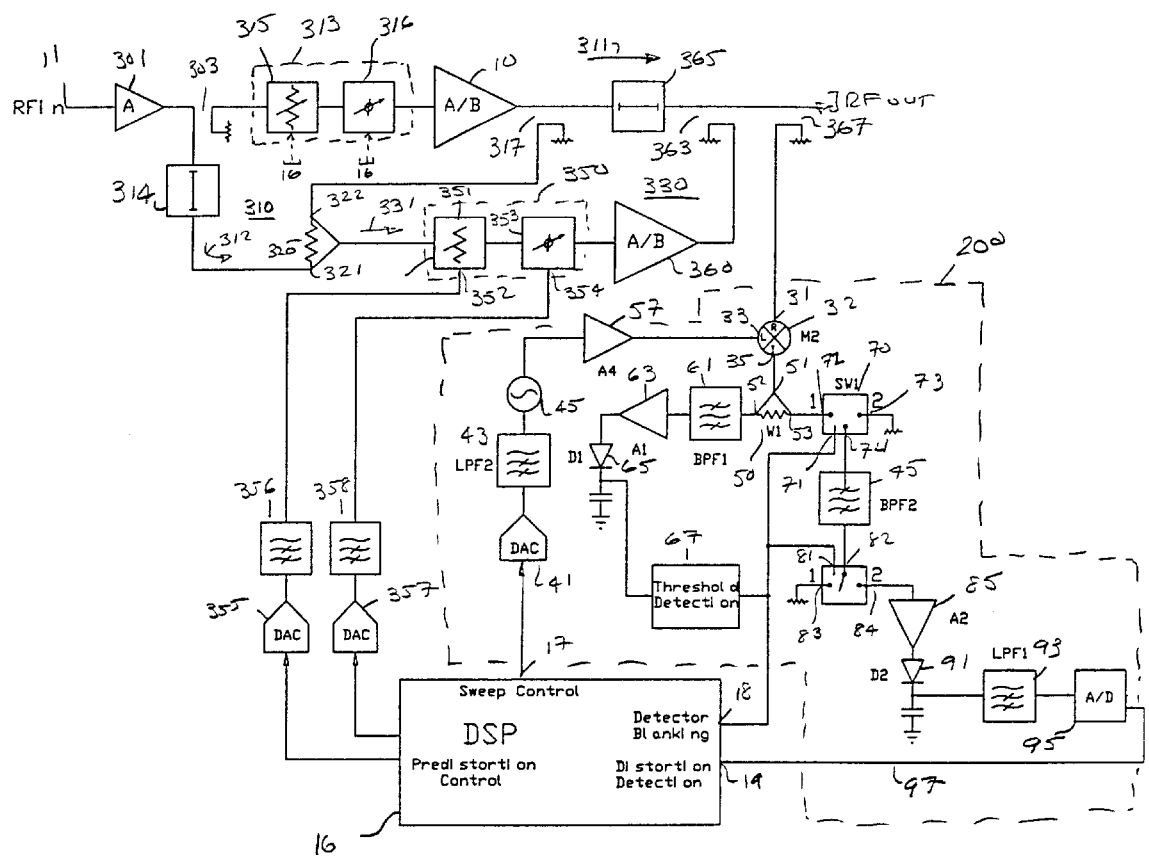
FIG. 4 diagrammatically illustrates an RF power amplifier distortion measurement and post-distortion correction scheme of a fourth, single receiver embodiment of the invention.
Figure 1:
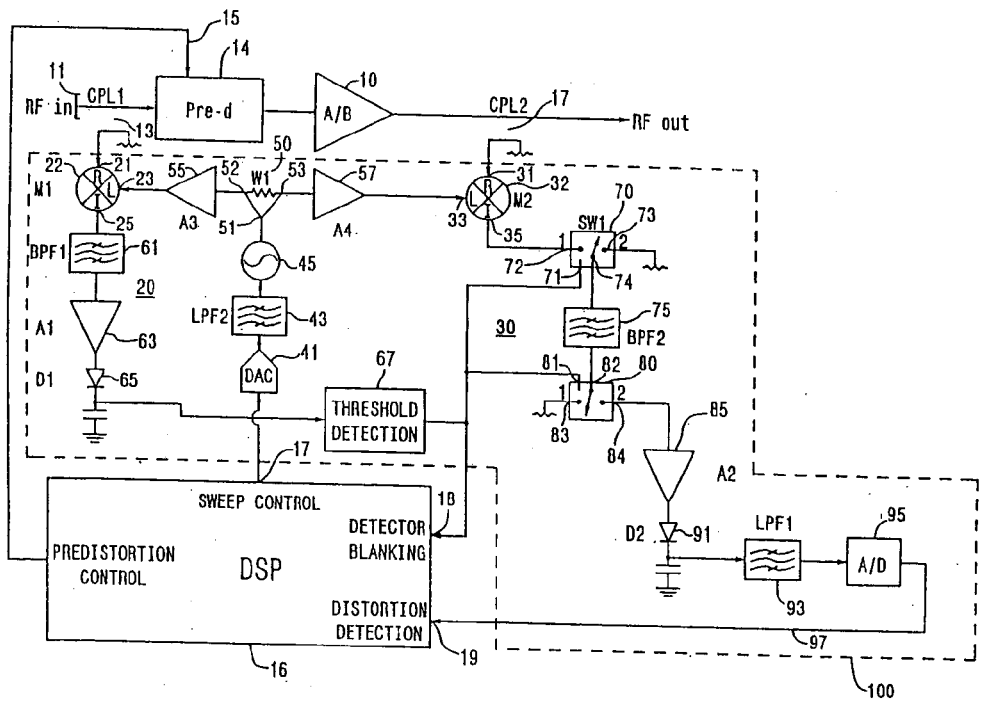
Figure 2:
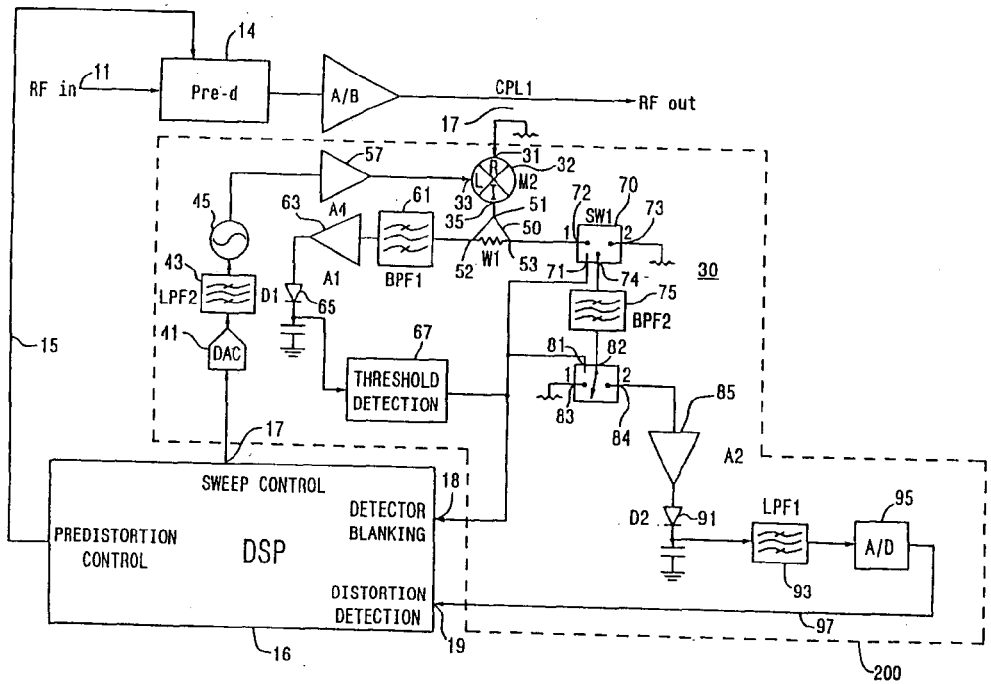
Figure 3:
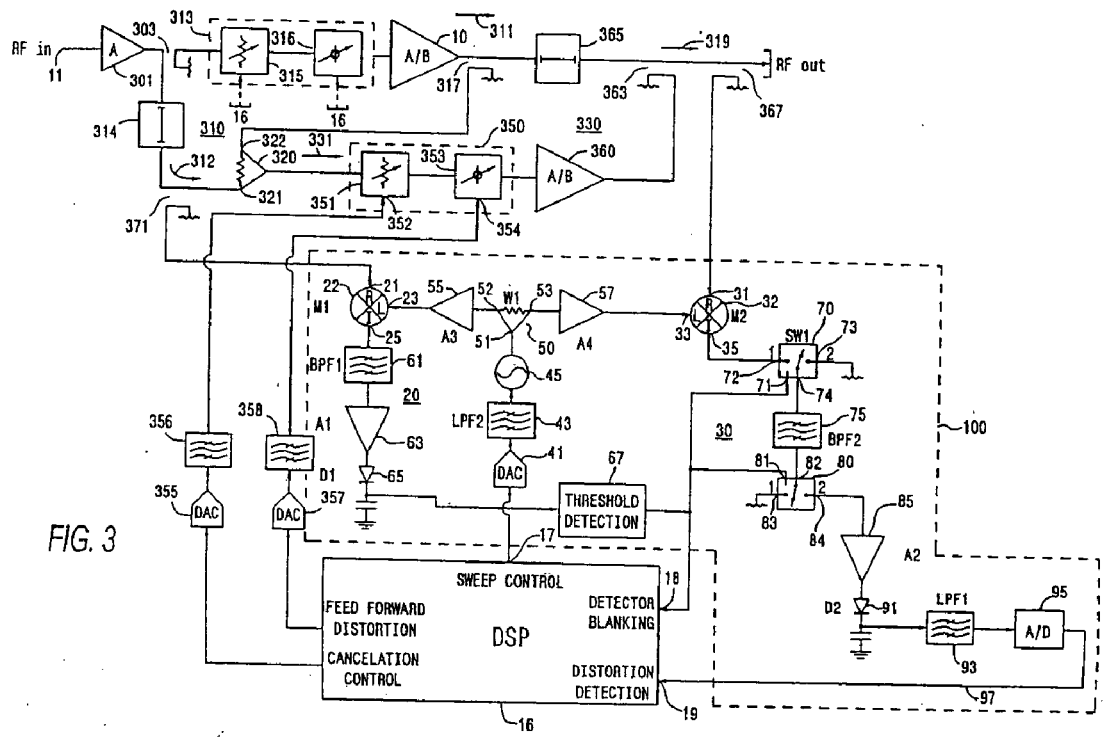
Figure 4:
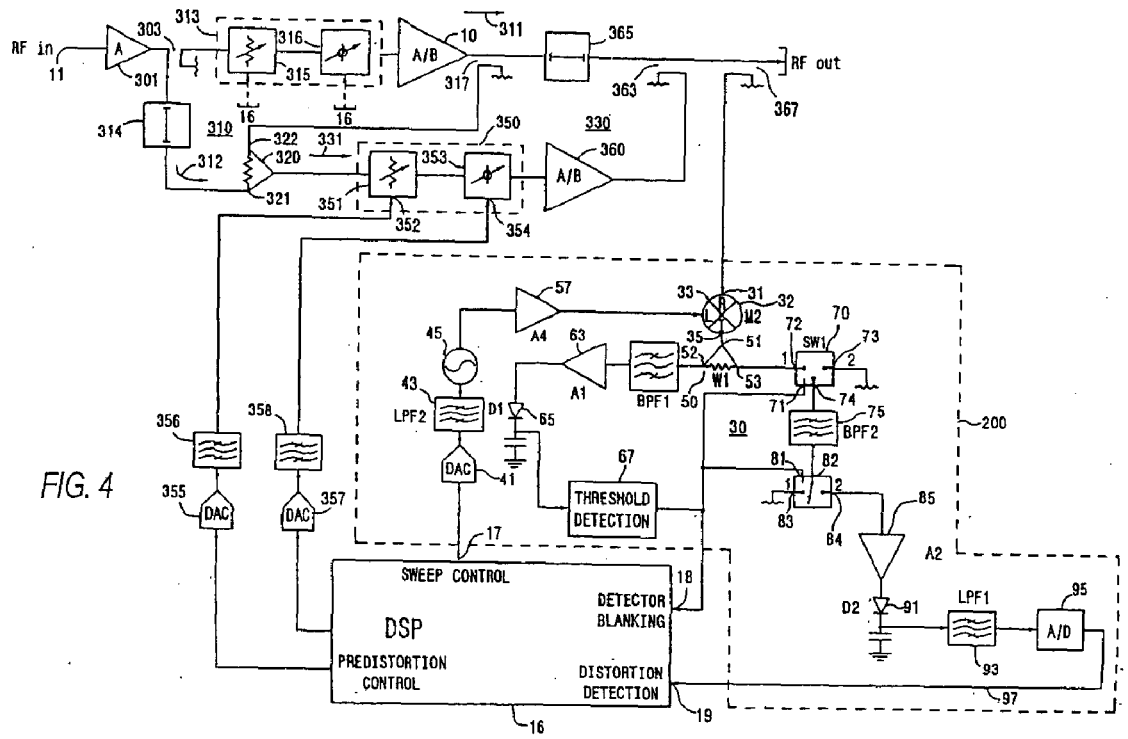

FIG. 4 diagrammatically illustrates a non-limiting example of an RF power amplifier distortion measurement and correction scheme in accordance with a fourth embodiment of the present invention, which is effectively a combination of the error measurement mechanism of FIG. 2 and a feed-forward cancellation amplifier architecture of FIG. 3 for an RF amplifier 10 having a relatively "high" C/I ratio.

For this purpose, the preamplification signal processing loop 310 and the feed-forward error extraction and reinjection loop 330 of the high C/I embodiment of FIG. 4 are configured and operate in the same manner as those in the low C/I embodiment of FIG. 3. The high C/I embodiment of FIG. 4 differs from the low C/I embodiment of FIG. 3, by replacing controllably blanked distortion energy measurement subsection 100 with the reduced complexity controllably blanked distortion energy measurement subsection 200 of the embodiment of FIG. 2.

As will be appreciated from the foregoing description of the invention, RF power amplifier distortion is readily accurately measured, even in the presence of multi-frequency input signals, by using a swept local oscillator to tune a receiver, whose output is compared with a threshold associated with the carrier. Whenever the power detected by the input receiver exceeds the threshold—indicating that the input receiver is tuned on a carrier—the signal path through the output receiver is blanked. As a consequence, as the output receiver is swept, its output is inferred to contain only distortion energy, which is digitized and processed to control pre-distortion correction circuitry or post-distortion circuitry of a feed-forward error correction loop. Advantageously, because frequency information is available during the oscillator sweep, selected samples may be emphasized, so that predistortion weights may be chosen to achieve optimum mask performance, rather than merely minimizing the total distortion energy over the operating bandwidth. The invention overcomes the relatively slow processing and high dynamic range requirements associated with spectrum analyzer techniques, which use a single output receiver to accurately measure the level of both carriers and distortion.

While we have shown and described several embodiments in accordance with the present invention, it is to be understood that the same is not limited thereto but is susceptible to numerous changes and modifications as are known to a person skilled in the art, and we therefore do not wish to be limited to the details shown and described herein but intend to cover all changes and modifications as are obvious to one of ordinary skill in the art.

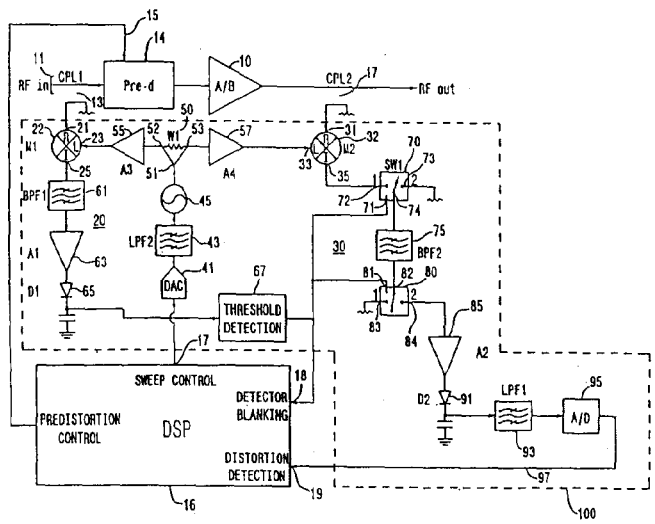

What is claimed is:

1. An RF power amplifier arrangement comprising:
    an RF input port to which an RF input signal is applied;
    an RF output port from which an amplified RF output signal is derived; and
    an RF signal processing path coupled between said input and output ports, and containing an RF power amplifier and an RF distortion correction unit that is controllably operative to adjust one or more parameters of said RF signal processing path so as to compensate for distortion introduced by said RF power amplifier, said RF distortion correction unit being coupled to derive information representative of said distortion introduced by said RF power amplifier over a prescribed bandwidth, but excluding the effect of an RF carrier frequency of said RF input signal; and
    wherein said RF distortion correction unit includes a frequency swept output receiver coupled to monitor energy contained in said amplified RF output signal, and being coupled to an output signal path that derives said information representative of said distortion introduced by said RF power amplifier over said prescribed bandwidth and excluding said RF carrier frequency.

2. An RF power amplifier arrangement according to claim 1, wherein said output signal path of said frequency swept output receiver is configured to be controllably interrupted in response to said RF output signal containing said RF carrier frequency.

3. An RF power amplifier arrangement according to claim 2, wherein said RF distortion correction unit includes a threshold detector that is operative to controllably interrupt said output signal path of said frequency swept output receiver, in response to said RF output signal containing RF carrier energy in excess of a threshold.

4. An RF power amplifier arrangement according to claim 2, wherein said RF distortion correction unit comprises an RF predistortion correction unit that controllably imparts distortion onto said RF input signal upstream of said RF amplifier, so as to cancel the distortion contributed by said RF amplifier.

5. An RF power amplifier arrangement according to claim 2, wherein said RF signal processing path includes a feed-forward error correction and reinjection loop containing an auxiliary RF error amplifier coupled in circuit with said RF output port of said RF power amplifier, and wherein said RF distortion correction unit comprises an RF distortion correction unit installed in said feed-forward error correction and reinjection loop upstream of said auxiliary RF error amplifier.

6. An RF power amplifier arrangement according to claim 5, wherein said output signal path of said frequency swept output receiver is configured to be controllably interrupted in response to said RF input signal containing said RF carrier frequency.

7. An RF power amplifier arrangement according to claim 6, wherein said RF distortion correction unit includes a threshold detector that is operative to controllably interrupt said output signal path of said frequency swept output receiver, in response to said RF input signal containing RF carrier energy in excess of a threshold.

8. An RF power amplifier arrangement according to claim 6, wherein said RF distortion correction unit comprises an RF predistortion correction unit that controllably imparts distortion onto said RF input signal upstream of said RF amplifier, so as to cancel the distortion contributed by said RF amplifier.

9. An RF power amplifier arrangement according to claim 6, wherein said RF signal processing path includes a feed-forward error correction and reinjection loop containing an auxiliary RF error amplifier coupled in circuit with said RF output port of said RF power amplifier, and wherein said RF distortion correction unit comprises an RF distortion correction unit installed in said feed-forward error correction and reinjection loop upstream of said auxiliary RF error amplifier.

10. An RF power amplifier arrangement comprising:
an RF input port to which an RF input signal is applied;
an RF output port from which an amplified RF output signal is derived; and
an RF signal processing path coupled between said input and output ports, and containing an RF power amplifier and an RF distortion correction unit that is controllably operative to adjust one or more parameters of said RF signal processing path so as to compensate for distortion introduced by said RF power amplifier, said RF distortion correction unit being coupled to derive information representative of said distortion introduced by said RF power amplifier over a prescribed bandwidth, but excluding the effect of an RF carrier frequency of said RF input signal; and
wherein said RF distortion correction unit includes a frequency swept input receiver coupled to monitor energy contained in said RF input signal, a frequency swept output receiver coupled to monitor energy contained in said RF output signal, and being coupled in an output signal path coupled that derives said information representative of said distortion introduced by said RF power amplifier, and wherein said RF distortion correction unit includes a threshold detector that is operative to controllably interrupt said output signal path of said frequency swept output receiver, in response to said RF input signal containing RF carrier energy in excess of a threshold.

11. An RF power amplifier arrangement according to claim 10, wherein said RF distortion correction unit comprises an RF predistortion correction unit that controllably adjusts the amplitude and phase of said RF input signal upstream of said RF amplifier.

12. An RF power amplifier arrangement according to claim 10, wherein said RF signal processing path includes a feed-forward error correction and reinjection loop containing an auxiliary RF error amplifier coupled in circuit with said RF output port of said RF power amplifier, and wherein said RF distortion correction unit comprises an RF distortion correction unit installed in said feed-forward error correction and reinjection loop upstream of said auxiliary RF error amplifier.

13. A method of measuring and compensating for distortion in an RF power amplifier to which an RF input signal is coupled and from which an amplified RF output signal is derived, said method comprising the steps of:

(a) deriving information representative of said distortion introduced by said RF power amplifier over a prescribed bandwidth, but excluding the effect of an RF carrier frequency present in said RF input signal; and (b) controllably adjusting one or more parameters of said RF signal processing path so as to compensate for distortion introduced by said RF power amplifier, in accordance with said information derived in step (a); and wherein step (a) comprises varying the frequency of operation of an output receiver that is coupled in an output signal path through which energy contained in said amplified RF output signal may be monitored, and extracting therefrom said information representative of said distortion introduced by said RF power amplifier over said prescribed bandwidth and excluding said RF carrier frequency.

14. A method of measuring and compensating for distortion in an RF power amplifier to which an RF input signal is coupled and from which an amplified RF output signal is derived, said method comprising the steps of:

(a) deriving information representative of said distortion introduced by said RF power amplifier over a prescribed bandwidth, but excluding the effect of an RF carrier frequency present in said RF input signal; and (b) controllably adjusting one or more parameters of said RF signal processing path so as to compensate for distortion introduced by said, RF power amplifier, in accordance with said information derived in step (a); and wherein step (a) comprises simultaneously varying the frequency of operation of each of an input receiver coupled to monitor energy contained in said RF input signal, and an output receiver coupled in an output signal path to said RF power amplifier and being operative to monitor energy contained in said RF output signal, and controllably interrupting said output signal path of said output receiver, in response to said RF input signal containing RF carrier energy in excess of a threshold.

15. A method according to claim 13, wherein step (a) further includes controllably interrupting said output signal path of said output receiver in response to said RF output signal containing RF carrier energy in excess of a threshold.

16. A method according to claim 13, wherein step (b) comprises controllably adjusting the amplitude and phase of said RF input signal upstream of said RF amplifier.

17. A method according to claim 13, wherein a feed-forward error correction and reinjection loop containing an auxiliary RF error amplifier is coupled in circuit with said RF output port of said RF power amplifier, and wherein step (b) comprises controllably adjusting the amplitude and phase of an RF signal input to said auxiliary RF error amplifier.

18. A method of measuring and compensating for distortion in an RF power amplifier to which an RF input signal is coupled and from which an amplified RF output signal is derived, said method comprising the steps of sweeping an oscillator to locate and isolate an RF carrier component in said amplified RF output signal, and thereby detect distortion energy produced at the output of said RF power amplifier exclusive of said RF carrier component, and controllably adjusting the operation of one of a pre-distortion unit and a post-distortion unit installed in a respective input and output path of said RF power amplifier in accordance with said distortion energy.

19. An arrangement for measuring distortion in an amplifier comprising:
   a first receiver coupled to measure carrier power at one of an input and output of said amplifier;
   a second receiver, having an operational bandwidth less than that of said first receiver, and being coupled to measure distortion energy at said output of said amplifier, except in response to said first receiver being tuned to carrier energy; and
   a swept local oscillator that is operative to sweep the frequency of operation of each of said first and second receivers in common.

20. An arrangement according to claim 19, further including a pre-distortion correction unit coupled in an input path of said amplifier, and being operative to controllably impart distortion onto an input signal upstream of said amplifier, so as to cancel distortion contributed by said amplifier, in accordance with said distortion energy measured by said second receiver.

21. An arrangement according to claim 20, further including a feed-forward error correction and reinjection loop containing an auxiliary error amplifier coupled in circuit with said output of said amplifier, and a post-distortion correction unit installed in said feed-forward error correction and reinjection loop upstream of said auxiliary error amplifier, and being operative to controllably impart distortion onto an output signal of said amplifier and coupled through said auxiliary error amplifier, so as to cancel distortion in accordance with said distortion energy measured by said second receiver.

* * * * *

UNITED STATES PATENT AND TRADEMARK OFFICE
CERTIFICATE OF CORRECTION

PATENT NO. : 6,407,635 B1
DATED : June 18, 2002
INVENTOR(S) : Lance Todd Mucenieks and David Kent Bonds It is certified that error appears in the above-identified patent and that said Letters Patent is hereby corrected as shown below:

The title page should be deleted and substitute therefore the attached title page.

Delete figures 1-4, and substitute therefore figures consisting of figures 1-4, as shown on the attached pages.

<u>Column 1</u>,
Line 51, delete "(IMDS)." insert -- (IMDs) --

<u>Column 4</u>,
Line 40, delete "control, the gain" insert -- control the gain --

<u>Column 5</u>,
Line 27, delete "grouping., whereby" insert -- grouping, whereby --
Line 66, delete "of the A amplified" insert -- of the amplified --

Signed and Sealed this

Twenty-fourth Day of August, 2004

JON W. DUDAS
*Director of the United States Patent and Trademark Office*

(12) United States Patent
Mucenieks et al.

(10) Patent No.: US 6,407,635 B2
(45) Date of Patent: Jun. 18, 2002

(54) CARRIER-BLANKING MECHANISM FOR SWEEPING DETECTOR USED TO MEASURE AND CORRECT RF POWER AMPLIFIER DISTORTION

(75) Inventors: Lance Todd Mucenieks, Boulder Creek, CA (US); David Kent Bonds, Quincy, IL (US)

(73) Assignee: Spectrian Corporation, Sunnyvale, CA (US)

( * ) Notice: Subject to any disclaimer, the term of this patent is extended or adjusted under 35 U.S.C. 154(b) by 0 days.

(21) Appl. No.: 09/928,127

(22) Filed: Aug. 10, 2001

Related U.S. Application Data

(63) Continuation of application No. 09/479,723, filed on Jan. 7, 2000, now abandoned.

(51) Int. Cl.[7] ................................................. H03F 1/26
(52) U.S. Cl. ....................................... 330/149; 330/136
(58) Field of Search ................................. 330/149, 151, 330/136; 375/296, 297

(56) References Cited

U.S. PATENT DOCUMENTS

| | | | |
|---|---|---|---|
| 4,885,551 A | 12/1989 | Myer | 330/52 |
| 5,119,040 A | 6/1992 | Long et al. | 330/149 |
| 5,489,875 A | 2/1996 | Cavers | 330/151 |
| 5,565,814 A | 10/1996 | Fukuchi | 330/52 |
| 5,742,201 A | 4/1998 | Eisenberg et al. | 330/2 |
| 5,923,214 A | 7/1999 | Mitzlaff | 330/52 |
| 5,929,704 A | 7/1999 | Proctor, Jr. et al. | 330/149 |
| 6,078,216 A | 6/2000 | Proctor, Jr. | 330/151 |
| 6,144,255 A | 11/2000 | Patel et al. | 330/151 |

Primary Examiner—Robert Pascal
Assistant Examiner—Henry Choe
(74) Attorney, Agent, or Firm—Allen, Dyer, Doppelt, Milbrath & Gilchrist, P.A.

(57) ABSTRACT

RF power amplifier distortion can be accurately measured in the presence of multi-frequency input signals, by using a swept local oscillator to tune RF input and output receivers. The power detected by the input receiver is compared with a threshold associated with the carrier. Whenever the power detected by the input receiver exceeds the threshold—indicating that the input receiver is tuned on carrier energy—the signal path through the output receiver is blanked. The sweeping action combined with selective blanking of the output receiver creates an adaptive notch filter, which allows for the direct measurement of low level distortion power in the presence of high power carriers. This distortion power is digitized and can be processed to control pre-distortion correction circuitry or gain/phase adjustment circuitry of a feed-forward error correction loop.

21 Claims, 4 Drawing Sheets